US009745668B2

(12) United States Patent
Fetzer et al.

(10) Patent No.: US 9,745,668 B2
(45) Date of Patent: Aug. 29, 2017

(54) ISOELECTRONIC SURFACTANT INDUCED SUBLATTICE DISORDERING IN OPTOELECTRONIC DEVICES

(71) Applicant: The Boeing Company, Chicago, IL (US)

(72) Inventors: Christopher M. Fetzer, Santa Clarita, CA (US); James H. Ermer, Burbank, CA (US); Richard R. King, Thousand Oaks, CA (US); Peter C. Colter, Canyon Country, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/499,452

(22) Filed: Sep. 29, 2014

(65) Prior Publication Data

US 2015/0083037 A1  Mar. 26, 2015
US 2017/0191185 A9  Jul. 6, 2017

Related U.S. Application Data

(60) Continuation of application No. 11/517,156, filed on Sep. 7, 2006, now Pat. No. 8,846,134, which is a division of application No. 10/263,626, filed on Oct. 2, 2002, now Pat. No. 7,126,052.

(51) Int. Cl.
*H01L 31/00* (2006.01)
*C30B 25/18* (2006.01)
*H01L 21/02* (2006.01)
*H01L 31/18* (2006.01)
*C30B 29/40* (2006.01)
*H01L 31/0687* (2012.01)

(52) U.S. Cl.
CPC ............ *C30B 25/186* (2013.01); *C30B 29/40* (2013.01); *H01L 21/0245* (2013.01); *H01L 21/02381* (2013.01); *H01L 21/02458* (2013.01); *H01L 21/02463* (2013.01); *H01L 21/02502* (2013.01); *H01L 21/02521* (2013.01); *H01L 21/02543* (2013.01); *H01L 21/02658* (2013.01); *H01L 31/0687* (2013.01); *H01L 31/184* (2013.01); *Y02E 10/544* (2013.01); *Y02P 70/521* (2015.11)

(58) Field of Classification Search
CPC .................................................. H01L 21/02381
See application file for complete search history.

(56) References Cited

U.S. PATENT DOCUMENTS

| | | | | |
|---|---|---|---|---|
| 6,480,520 B1 * | 11/2002 | Razeghi | ................. | B82Y 20/00 372/96 |
| 6,660,928 B1 * | 12/2003 | Patton | ................. | H01L 31/0687 136/249 |
| 6,815,736 B2 * | 11/2004 | Mascarenhas | ........ | H01L 29/167 136/249 |

OTHER PUBLICATIONS

Jun et al., "Isoelectronic surfactant-induced surface step structure and correlation with ordering in GaInP," Journal of Crystal Growth 235 (2002) 15-24.*

(Continued)

*Primary Examiner* — Robert Vetere
(74) *Attorney, Agent, or Firm* — Patterson + Sheridan, LLP

(57) ABSTRACT

A method of disordering a layer of an optoelectronic device including; growing a plurality of lower layers; introducing an isoelectronic surfactant; growing a layer; allowing the surfactant to desorb; and growing subsequent layers all performed at a low pressure of 25 torr.

28 Claims, 7 Drawing Sheets

(56) References Cited

OTHER PUBLICATIONS

Lee et al., "Surfactant controlled growth of GaInP by organometallic vapor phase epitaxy," Journal of Applied Physics 87, 8 (2000) 3730-3735.*

Shurtleff et al., "Time dependent surfactant effects on growth of GaInP heterostructures by organometallic vapor phase epitaxy," Journal of Crystal Growth 234 (2002) 327-336.*

* cited by examiner

ISOELECTRONIC SURFACTANT INDUCED SUBLATTICE DISORDERING IN OPTOELECTRONIC DEVICES

CROSS-REFERENCE TO RELATED APPLICATIONS

This application claims priority to U.S. patent application Ser. No. 11/517,156, filed Sep. 7, 2006, now U.S. Pat. No. 8,846,134, which claims priority to U.S. patent application Ser. No. 10/263,626, filed Oct. 2, 2002, now U.S. Pat. No. 7,126,052, both entitled "Isoelectronic Surfactant Induced Sublattice Disordering in Optoelectronic Devices," the contents of which are both incorporated by reference in their entirety as if fully set forth herein.

GOVERNMENT RIGHTS

This invention was made with Government support under contact no. F29601-98-2-0207 awarded by the U.S. Air Force. The government has rights in this invention.

BACKGROUND OF THE INVENTION

The present invention generally relates to semiconductor materials and isoelectronic surfactant-induced sublattice disordering in optoelectronic devices and, more particularly, to a method of surfactant-induced sublattice disordering for solar conversion and other photovoltaic devices.

The interest in photovoltaic (PV) cells in both terrestrial and non-terrestrial applications continues as concerns over pollution and limited resources increase. Irrespective of the application, and as with any energy generation system, efforts have been ongoing to increase the output and/or increase the efficiency of PV cells. To increase the electrical power output of such cells, multiple subcells or layers having different energy band gaps have been stacked so that each subcell or layer can absorb a different part of the wide energy distribution in the sunlight. This situation is advantageous, since each photon absorbed in a subcell corresponds to one unit of charge that is collected at the subcell operating voltage, which is approximately linearly dependent on the band gap of the semiconductor material of the subcell. An ideally efficient solar cell would have a large number of subcells, each absorbing only photons of energy negligibly greater than its band gap.

The most efficient and therefore dominant technology in multifunction photovoltaic cells is 2- and 3-junction GaInP/Ga(In)As/Ge cells. These monolithic cells are grown lattice matched to GaAs or Ge substrates. While variations on this material system, such as AlInGaP or lattice mismatched GaInP top cells, might provide a more ideal match of band gaps to the solar spectrum, practical considerations have indicated that lattice matched GaInP is preferred for large scale production. Addition of even small amounts of aluminum to the top cell to form AlInGaP simultaneously incorporates oxygen and thus quickly degrades the minority carrier lifetime and performance of the device. Lattice mismatched GaInP top cells induce dislocation formation having a similar effect.

In monolithic, series-interconnected, 2- and 3-junction GaInP/Ga(In)As/Ge solar cells, it is desirable for the GaInP top subcell to have nearly the same photogenerated current density as the Ga(In)As subcell. If the currents are different, the subcell with the lowest photogenerated current will limit the current through all of the series-interconnected subcells in the multifunction (MJ) cell, and excess photogenerated current in other subcells is wasted. Limiting the current in this manner results in a severe penalty on the MJ cell efficiency.

At the lattice constant of Ge (or of GaAs) substrates, GaInP grown under conventional conditions has an ordered group-Ill sublattice and therefore has a band gap which is too low to achieve the desired current match between subcells in the unconcentrated or concentrated AM0 space solar spectrum, the unconcentrated or concentrated AM1.5D and AM1.5G terrestrial solar spectra, and other solar spectra, unless the top subcell is purposely made optically thin, as in U.S. Pat. No. 5,223,043. To achieve the highest efficiencies, the thickness of the subcells in MJ cells are tuned to match the current in each subcell. As may be appreciated from the initial discussion of multifunction solar cells, it would be preferable to do the current matching by increasing the band gap of the top cell rather than reducing its thickness, producing a higher voltage at the same current. An important property of GaInP is that its band gap varies with growth conditions. GaInP grown under conventional conditions is GaInP with a $CuPt_B$ ordered group-Ill sublattice. The result of this ordering may be a decrease in band gap of up to 470 meV for completely ordered material compared with completely disordered material. A. Zunger, MRS Bulletin, 22, (1997) p. 20-26. Typically, this loss in band gap is only 120 meV since the ordering is only partial. The amount of ordering contained in a sample is described by the order parameter, η, which ranges from 0 (disordered) to 1 (completely ordered). G. B. Stringfellow, MRS Bulletin, 22, (1997) p. 27-32.

If the GaInP top cell is fully disordered, an optically thick top cell is nearly current matched for the AM1.5D and AM1.5G terrestrial spectra, but still must be slightly optically thin to match the AM0 spectrum. The increase $\Delta E_g$ in band gap results in an increase in open-circuit voltage $V_{oc}$ of approximately $\Delta E_g/q$ (typically 100 mV) for fully disordered GaInP as compared to partially ordered GaInP.

A conventional process 100 of forming a MJ cell is shown in FIG. 1. In a step 110, lower layers, including a buffer layer and a middle cell, in a structure are grown. Next, in a step 120, an n-type side of a tunnel junction (TJ) n++ layer is grown. Next, in a step 130, the p++ side of the TJ, a back surface field layer, and a GaInP top cell are grown. In a step 140, a window layer is grown. Next, in a step 150, the process is paused. Finally, in a step 160, a cap layer is grown. Under typical growth conditions, process 100 results in a MJ cell having the disadvantages identified herein.

The tuning of the band gap by controlling CuPt-type ordering has been studied. Early on, G. B. Stringfellow, "Order and Surface Processes in III-V Semiconductor Alloys," MRS Bulletin, July 1997, p. 27-32 concluded that there was a one-to-one relationship between the degree of order and phosphorus (P) dimers on the surface at a growth temperature between 620-720° C. and partial pressure of <200 Pa. Additionally, it has long been known that growth at sufficiently high temperature would produce disordered GaInP. However, the high growth temperature required is not necessarily compatible with the growth of the complex multijunction cells on Ge substrates or may exceed those attainable by commercially available MOVPE reactors.

C. M. Fetzer et al., "The use of a surfactant (Sb) to induce triple period ordering in GaInP," Appl. Phys. Lett., Vol, 76, No. 11, 13 Mar. 2000 indicated that Sb (and Bi) had been previously added as an isoelectronic surfactant during the growth of GaInP to alter the surface by replacing P dimers with Sb (or Bi) and to eliminate ordering. The term "isoelectronic" in relation to P was to describe the fact that Sb and P had the same number of valence electrons, the absence of first order changes in the Fermi level of the GaInP layer, and the lack of incorporation into the GaInP surface, which is in contrast to "dopant" surfactants.

G. B. Stringfellow et al., "Surface processes in OMVPE—the frontiers," Journal of Crystal Growth 221 (2000) 1-11 used the surfactants Te (a donor) and As, Sb, and Bi (isoelectronic with P) for GaInP grown by organometallic vapor-phase epitaxy (OMVPE). Stringfellow et al. reported that each of the surfactants produced disordered layers under conditions that would normally produce highly ordered GaInP. It was suggested that As and Sb operated by surface changes, Te operated by kinetic effects, and Bi operated by both surface changes and kinetic effects.

More recently, C. M. Fetzer et al., "Effect of surfactant Sb on carrier lifetime in GaInP epilayers," J. Appl. Phys., Vol. 91, No. 1, 1 Jan. 2002 grew $Ga_{0.52}In_{0.48}P$ on GaAs using Sb as a surfactant at various concentrations. At an intermediate concentration (Sb/III(v)=0.016), CuPt ordering decreased and band gap energy increased. At a higher concentration (Sb/III(v)=0.064), band gap energy decreased due to the onset of composition modulation.

Similarly, S. W. Sun et al., "Isoelectronic surfactant-induced surface step structure and correlation with ordering in GaInP," Journal of Crystal Growth 235 (2002) 15-24 studied the surfactant concentration effects of As, Sb, and Bi. They noted that the intentional modulation of ordering could be used to fabricate heterostructures and quantum wells without changing the compositional material. In particular, the process could be used for solar cells, diodes, and lasers.

A disorder-on order-on disorder heterostructure using the surfactant Sb on GaInP was described by J. K. Shurtleff et al., "Time dependent surfactant effects on growth of GaInP heterostructures by organometallic vapor phase epitaxy," Journal of Crystal Growth 234 (2002) 327-336. The heterostructures grown with interruptions in growth produced thin ordered layers and sharp interfaces.

In all of the above prior art describing the effect of isoelectronic surfactants on disordering GaInP, the experiments were carried out at an overall system pressure of 760 torr, or atmospheric pressure. Practical manufacture of high-volume and large-area epitaxy is optimally performed at low pressure to achieve the best uniformity and highest throughput. This difference in pressure is significant in that the hydrodynamics are vastly different between the two growth regimes. These differences are highlighted by Kikkawa et al., "Ordered-InGaPSb—GaAs-based FET and HBT structures grown by MOVPE," 2001 Int. Conf. Proc on InP and Related Materials (2001) p. 464 who conclude that Sb surfactant disordering did not work at low pressures below ~100 torr. Although this does not prove that the disordering does not function at low pressure, it does illustrate that the growth regimes used in research and manufacture are very different. Specifically, reduction of an idea functional in research to practice on manufacturing scales may require significant innovation.

As can be seen, there is a need for a process of making an optoelectronic device with a specific GaInP material system having a top subcell that converts photogenerated current densities at as high a voltage as possible and thereby maximizes the efficiency of the photovoltaic cell. Furthermore, there is a need for a process of making a photovoltaic cell with a specific GaInP material system having higher values of $V_{oc}$ and $V_{mp}$. Such a photovoltaic cell preferably includes a top subcell having the highest possible band gap achievable for lattice matched GaInP.

SUMMARY OF THE INVENTION

In one aspect of the present invention, a method of making an optoelectronic device includes growing a plurality of lower layers; growing a first side of a tunnel junction layer; pausing; introducing an isoelectronic surfactant; growing a second side of the tunnel junction layer, back surface field layer and a top cell; pausing to allow the surfactant to desorb; and growing subsequent layers at low pressure (such as 25 torr).

In another aspect of the invention, a method of making an optoelectronic device includes growing a plurality of lower layers; pausing; introducing an isoelectronic surfactant; growing a top cell base and emitter; pausing to allow the surfactant to desorb; and growing subsequent layers at low pressure.

In yet another aspect of the present invention, a method of making an optoelectronic device includes growing a plurality of lower layers; growing a first side of a tunnel junction layer; pausing; introducing an isoelectronic surfactant chosen from the group consisting of Sb, As, Bi, and Tl; growing a second side of the tunnel junction layer, back surface field layer and a top cell; pausing to allow the surfactant to desorb; and growing subsequent layers at low pressure.

In a further aspect of the present invention, a method of making an optoelectronic device includes growing a plurality of lower layers; growing a first side of a tunnel junction layer; pausing; introducing Sb in a molar ratio of triethylantimony (TESb) to trimethylgallium (TMGa) and trimethylindium (TMIn) of TESb/(TMGa+TMIn)=0.008; growing a second side of the tunnel junction layer, back surface field layer and a top cell; allowing the TESb to desorb; and growing subsequent layers at low pressure.

In another aspect of the present invention, a solar cell includes a substrate; a plurality of lower layers disposed upon the substrate; and an isoelectronic surfactant induced, lattice disordered top layer disposed upon the plurality of lower layers wherein the top layer is lattice matched to the substrate.

In a further aspect of the present invention, a satellite includes a plurality of solar cells, each solar cell including a substrate, a plurality of lower layers disposed upon the substrate, and an isoelectronic surfactant induced, lattice disordered top layer disposed upon the plurality of lower layers wherein the top layer is lattice matched to the substrate.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention generally provides a method of disordering a layer of an optoelectronic device including growing a plurality of lower layers at low pressure (e.g., ~25 torr); pausing growth in order to enable an isoelectronic surfactant surface layer build up; introducing an isoelectronic surfactant; growing a layer or layers of the optoelectronic device in the presence of the isoelectronic surfactant; halting the flow of the isoelectronic surfactant to the growth surface and allowing the surfactant to desorb; and growing subsequent layers. The term "isoelectronic" surfactant is intended to be distinguished from a "dopant" surfactant in that the former is characterized by the surfactant and associated layer element having the same number of valence electrons, the absence of first order changes in the Fermi level of the layer, and the lack of incorporation into the layer surface. A device produced in accordance with the invention is characterized by, among other things, a top cell having an ordering parameter between about 0.0 to 0.3, consequent increased band gap in the top cell, and increased device efficiency.

For example, the present invention may introduce an isoelectronic surfactant during the growth of a structure, which is in contrast to prior art methods which do not use a surfactant under the particular processing conditions and material systems of the present invention. In accordance with the present invention, and as an example, a band gap of GaInP lattice-matched to Ge (with a composition of approximately $Ga_{0.505}In_{0.495}P$) can be increased from approximately 1.785 eV to 1.890 eV, representing over a 5% increase. In the prior art, the increase may be about 5%.

Figure 7:
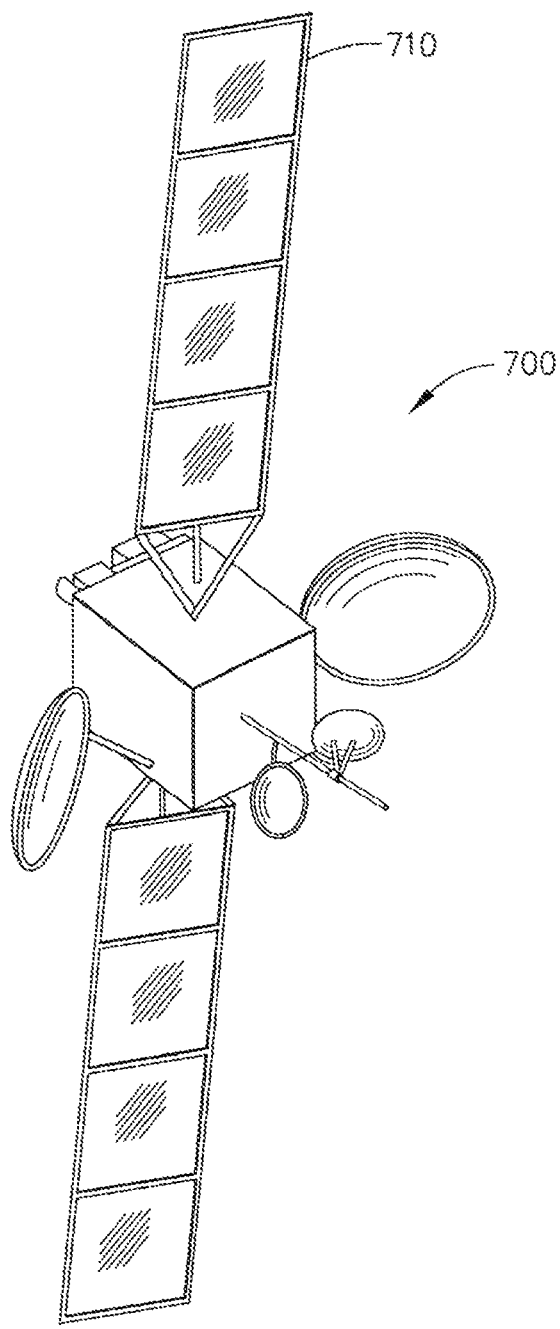
FIG. 7 is a representation of a satellite that employs the present invention.

The present invention finds broad applicability in both space and terrestrial applications. As such, the device of the invention may be used in a solar cell array 710 deployed on a satellite 700 (FIG. 7). Furthermore, the exemplary GaInP/Ga(In)As/Ge photovoltaic cell of the present invention provides for reduced system cost by achieving an increased band gap in the top cell material while still maintaining the material lattice constant matched to the substrate.

As further described below, the present invention may be used in single junction or multijunction solar cells and preferably in the top subcell of such devices. The present invention may be used in a homojunction cell or subcell, i.e., a cell or subcell in which the p-n junction is formed between a p-type semiconductor and an n-type semiconductor both of which have the same chemical composition of the matrix semiconductor and the same band gap, differing only in the dopant species and/or type. The present invention may also be used in a heterojunction cell or subcell, i.e., a cell or subcell in which the p-n junction is formed between a p-type semiconductor and an n-type semiconductor having different chemical compositions of the matrix semiconductors in the p-type and n-type regions, and/or different band gap energies in the p-type and n-type regions, in addition to the different dopant species and type in the p-type and n-type regions that form the p-n junction.

As also further described below, an aspect of the method of the present invention includes adding a small amount of an isoelectronic surfactant during the epitaxial growth of top cell layers—particularly GaInP layers. The amount of surfactant to group-III precursors (Sb/III(v)) may vary from about $1\times10^{-5}$ to 0.2, and preferably from about 0.004 to 0.018. As an example, with Sb as the isoelectronic surfactant and a GaInP top cell layer, the molar ratio of Sb to P in the vapor phase may be approximately $4\times10^{-4}$. This is intended to cause atomic disordering by changing the top cell layer surface reconstruction, such as by modifying the bonding at the surface, resulting in changes in the surface energy and the growth process at or near the surface. This results in an elimination of $CuPt_B$ ordering such that the ordering parameter $\eta$ in the top cell layer is between about 0.00 to 0.3 and preferably about 0.0 to 0.1, wherein:

$$\eta = \frac{\sqrt{2005 - E_{peak,12k}}}{471}$$

and $E_{peak,\ 12K}$ is the measured PL peak energy measured in meV at 12K. The consequent increased band gap in the top cell layer can be, as an example, from about 470 meV to 0 meV and preferably be about 100 meV. Upon such increase, the top cell layer band gap can be between about 1.78 to 1.92 eV at room temperature.

The isoelectronic surfactant may include a low vapor pressure element that does not incorporate easily into the solid of the top cell layer. As noted above, in one embodiment, the surfactant can be Sb. However, other possible isoelectronic surfactants may be used including As, Sb, Bi, and Tl, including mixtures thereof. This list is not exhaustive, and may include other elements or compounds not listed here as will be appreciated by those skilled in the art. In the case of III-V materials, desirable surfactants will be those which alter the group-V terminated surface during growth and are isoelectronic with the host lattice, i.e. they do not directly alter the free electron or hole concentration in the resulting solid.

Although the method of the present invention, including the use of an isoelectronic surfactant, provides a way to control the sublattice order particularly of GaInP, the invention may also be used for semiconductors such as GaInAs, GaAsSb, GaPAs, GaInPAs, AlInP, AlGaInP, AlGaAs, AlGaInAs, AlGaAsSb, AlGaPAs AlInAs, InPAs, AlInPAs, SiGe, CdZnSe, CdZnTe, ZnSSe, ZnSeTe, CuGaInSe, CuGaInSSe, and AgGaInSe.

Figure 1:
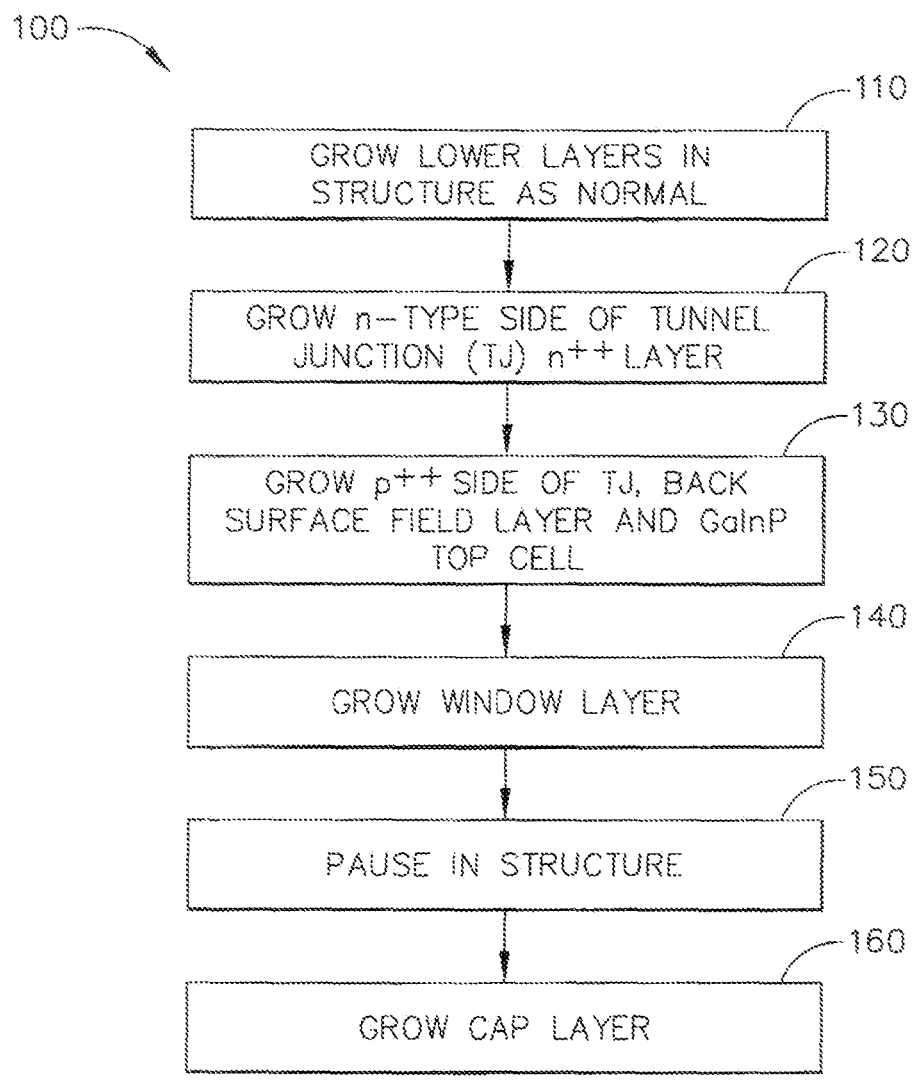
FIG. 1 is a flow diagram of a prior art process.
Figure 2:
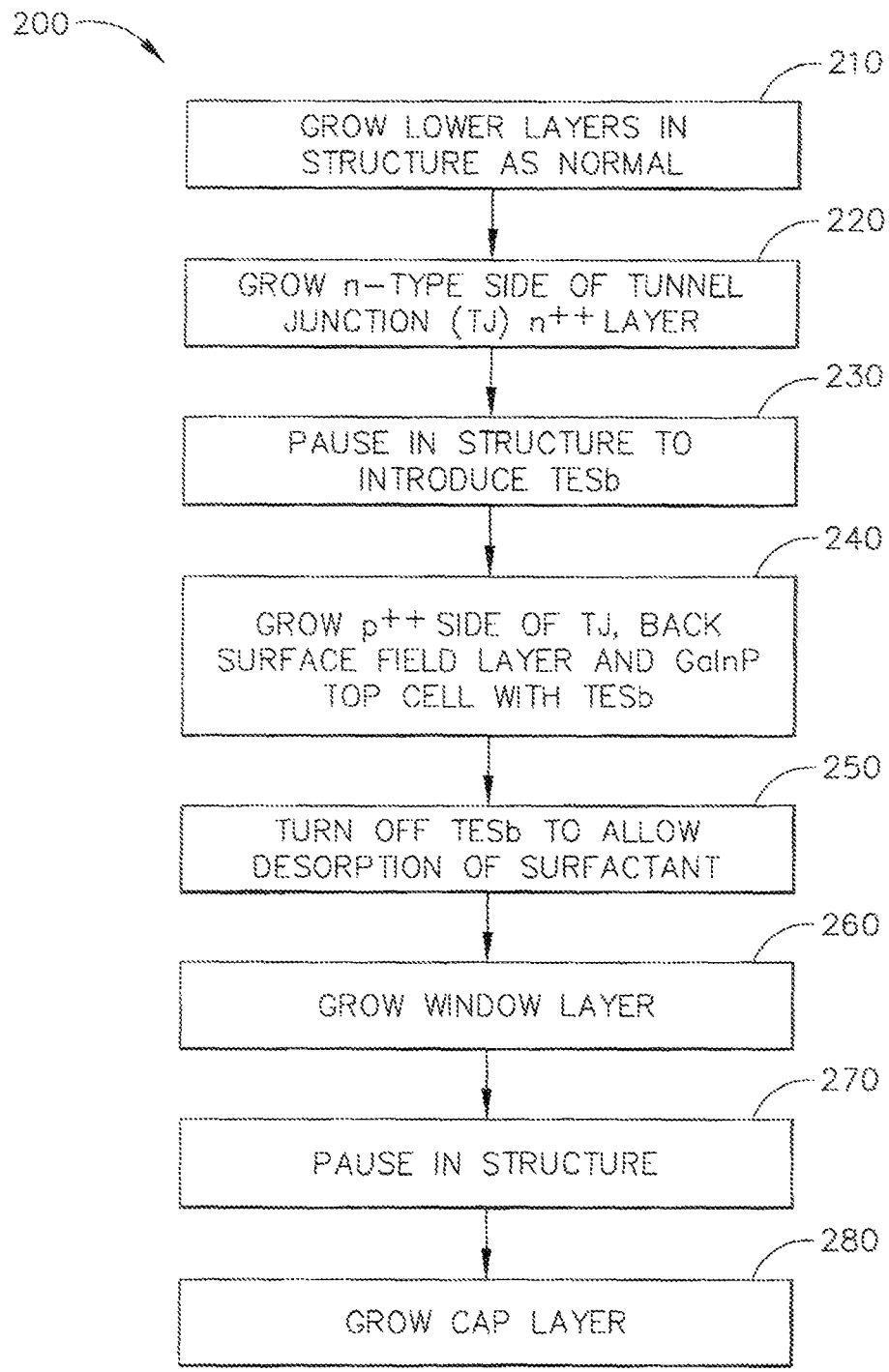
FIG. 2 is a flow diagram of a process in accordance with the invention.

In more specifically describing the overall method of the present invention, and with reference to FIG. 2, there is shown an exemplary process 200. However, it should be understood that the following is but one embodiment of the present invention and should not be taken as limiting the present invention. Surprisingly, best solar cell performance at low pressure growth does not occur at the Sb flux which, according to the prior art, produces the highest band gap GaInP. This may be due to the fact that the onset of composition modulation or a limited lateral phase separation actually hinders overall performance.

The process 200 may be carried out at low pressure, such as from about 10 to 100 torr and desirably at about 25 torr. At such pressure, the process 200 may have a growth temperature of about 600 to 700° C. and desirably at about 640° C. A growth rate for the process 200 may be about 200 to 600 Å/min and desirably about 400 Å/min.

In a step 210, lower layers, such as a bottom subcell 440 and a middle subcell 430 (FIG. 4) of a structure, are grown using conventional methods such as vapor phase epitaxy. Next, in a step 220, an n-type side of a tunnel junction (TJ) n++ layer 419 can be grown. An n-type dopant precursor molar flow may be about 1.25 micromol/min, for instance. In a step 230, a first pause in the process can occur, such as about 0.05 to 5 minutes and preferably about 4.0 minutes, during which the isoelectronic surfactant is introduced into the growth reactor. The first pause is of an amount that can allow for a reasonable build up of surfactant on the layer prior to growth of a subsequent structure to be disordered. Thereafter, an isoelectronic surfactant in the form of a precursor, such as TESb, can be introduced at a same flow rate for growth of subsequent layers as follows.

Next, in a step 240, a p++ side of the TJ 418 can be grown with a p-type dopant precursor molar flow of about 1.5 micromol/min, for example. Thereafter, a back surface field layer 415, and a GaInP top cell 410 may be grown respectively. In such example, the layers may be grown with TESb as the surfactant and present according to the molar ratio of TESb/(TMGa+TMIn) or Sb/III(v). This ratio may vary from about $1\times10^{-5}$ to 0.1, and preferably equal about 0.012, as an example. In the exemplary process 200, the TMGa molar flow and TMIn molar flow can respectively be about 1.229 and 1.0 micromol/min, for example. In a step 250, the TESb can be turned off to allow it's desorption during a second pause that may be about 0.1 to 5 minutes and preferably about 0.5 minutes. Finally, in steps 260, 270, and 280, a window layer 412 may be grown and followed by a pause. Then, a cap layer 408 may be grown.

Figure 3:
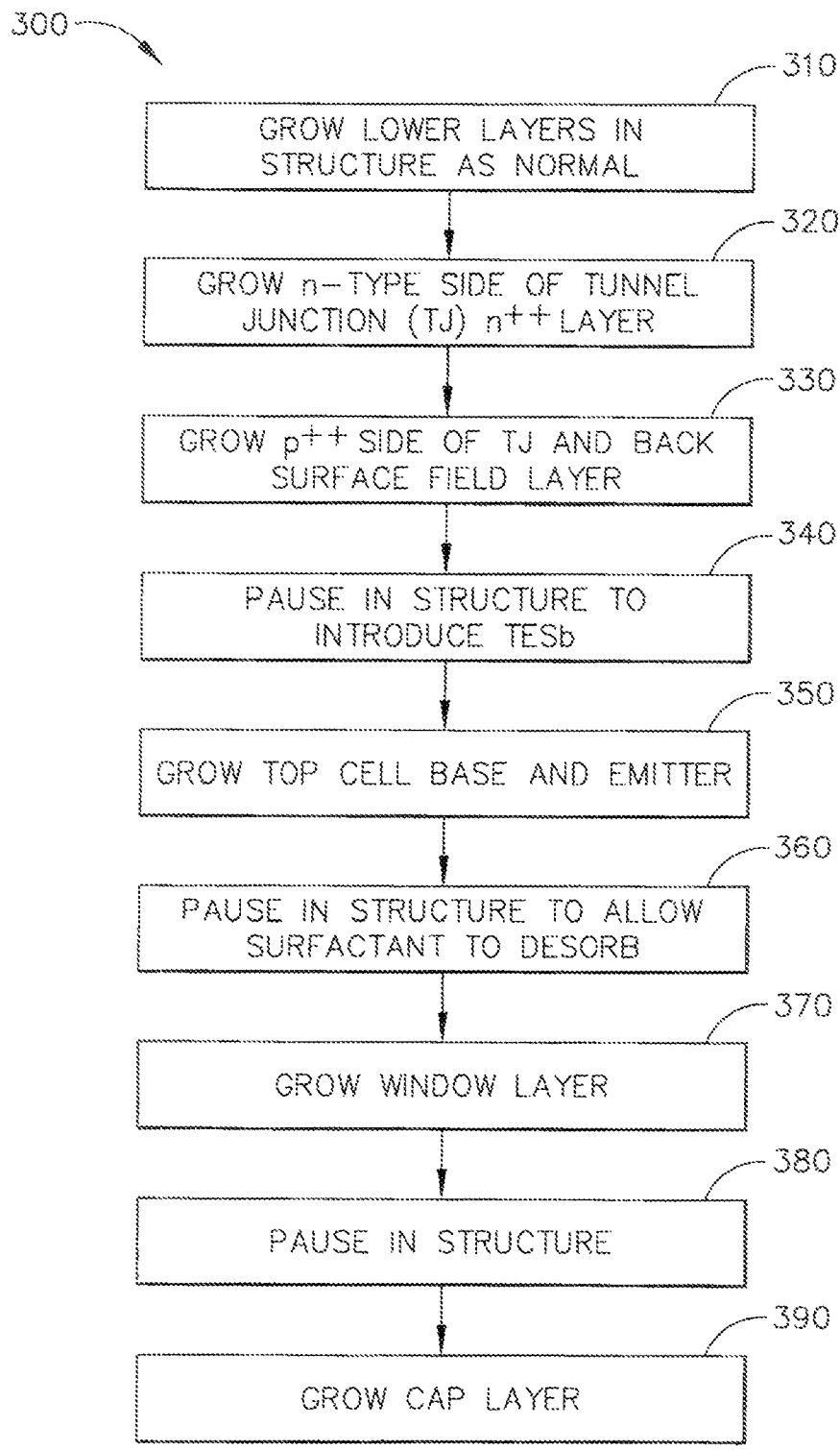
FIG. 3 is a flow diagram of an alternative process in accordance with the invention.

An alternative process 300 is shown in FIG. 3 in which the TESb may be introduced at a point different from that described above. However, the general operating parameters—such as pressure, temperature, and molar flow—may remain the same as in FIG. 2. The process 300 can include a step 310 in which lower layers, such as a bottom subcell 440 (FIG. 4) and a middle subcell 430 of a structure, are grown using conventional methods such as vapor phase epitaxy. Next, in a step 320, an n-type side of a tuned junction (TJ) n++ layer 419 may be grown. In a step 330, a p++ side of the TJ 418 and a back surface field layer 415 may be grown. Next in a step 340, there is a first pause in the process. A surfactant such as TESb can then be introduced at a same flow rate for growth of subsequent layers as follows.

In a step 350, a top cell base 414 and emitter 412 may be grown with TESb at TESb/(TMGa+TMIn) equal to 0.012, as an example. In a step 360, during a second pause in the process, the TESb can be turned off to allow its desorption. Finally, in steps 370, 380, and 390, a window layer 412 can be grown, the process can be paused a third time, such as a pause of 0.5 minutes as an example, and a cap layer 408 can be grown.

By employing either process 200 or 300, an isoelectronic surfactant induced, lattice disordered top layer that is lattice matched to a substrate can be produced. By way of example, a group-III sublattice of Ga and In atoms in GaInP can be disordered, including nearly destroying the $CuPt_B$ ordering. In this manner, the band gap of GaInP lattice-matched to Ge (with a composition of approximately $Ga_{0.505}In_{0.495}P$) or to GaAs (with a composition of approximately $Ga_{0.515}In_{0.485}P$) may be increased by 100 meV without changing the composition or lattice constant of the GaInP. Thus, by changing the $CuPt_B$ ordering state of the group-III sublattice from highly-ordered ($\eta \sim -0.5$) that is ordering on {111} planes, to highly-disordered, that is near elimination of the $CuPt_B$ ordering ($\eta \sim -0.0$), the band gap of $Ga_{0.505}In_{0.495}P$ lattice-matched to Ge can be increased from 1.785 to 1.890 eV, and the band gap of $Ga_{0.15}In_{0.485}P$ lattice-matched to GaAs can be increased from 1.800 to 1.900 eV. Of course, the amount of band gap increase may vary with the materials employed, such as by about 0.1 to 5%, and preferably by more than about 5%.

The isoelectronic surfactant induced, lattice disordered top layer according to the present invention can be produced in other embodiments, in addition to that mentioned above. As further examples, a GaInP layer of the present invention may comprise $Ga_{0.515}In_{0.485}P_{1-x}Sb_x$ wherein Sb is the isoelectronic surfactant, and x ranges from about 0.00001 to 0.01. In such instance, a Ga and In ratio can be adjusted to maintain lattice matching according to the relation $(Ga_{0.515}In_{0.485}P)_{1-z}(GaP_{0.686}Sb_{0.314})z$ where x=z*0.314.

In another embodiment, the GaInP disordered layer of the present invention may comprise $Ga_{0.515}In_{0.485}P_{1-x}Bi_x$ wherein Bi is the isoelectronic surfactant, and x ranges from about $1\times10^{-8}$ to $1\times10^{-3}$. In this instance wherein the amount of Bi is very small, a Ga and In ratio may not need to be adjusted to maintain lattice matching.

Yet another embodiment for an isoelectronic surfactant induced GaInP layer comprises $Ga_{0.515}In_{0.485}P_{1-x}As_x$ wherein As is the isoelectronic surfactant, and x ranges from about $1\times10^{-2}$ to 0.15. In such instance, a Ga and In ratio can be adjusted to maintain lattice matching according to the relation $(GaAs)_z \, Ga_{0.551}In_{0.485}P)_{1-z}$, where the As mole fraction=z.

In a still further embodiment, the GaInP layer of the present invention may comprise $(Ga_{0.515}In_{0.485})_{1-x}Tl_xP$ wherein Tl is the isoelectronic surfactant, and x ranges from about $1\times10^{-8}$ to $1\times10^{-3}$. In this instance wherein the amount of Tl is very small, a Ga and In ratio may not need to be adjusted to maintain lattice matching.

Figure 4:
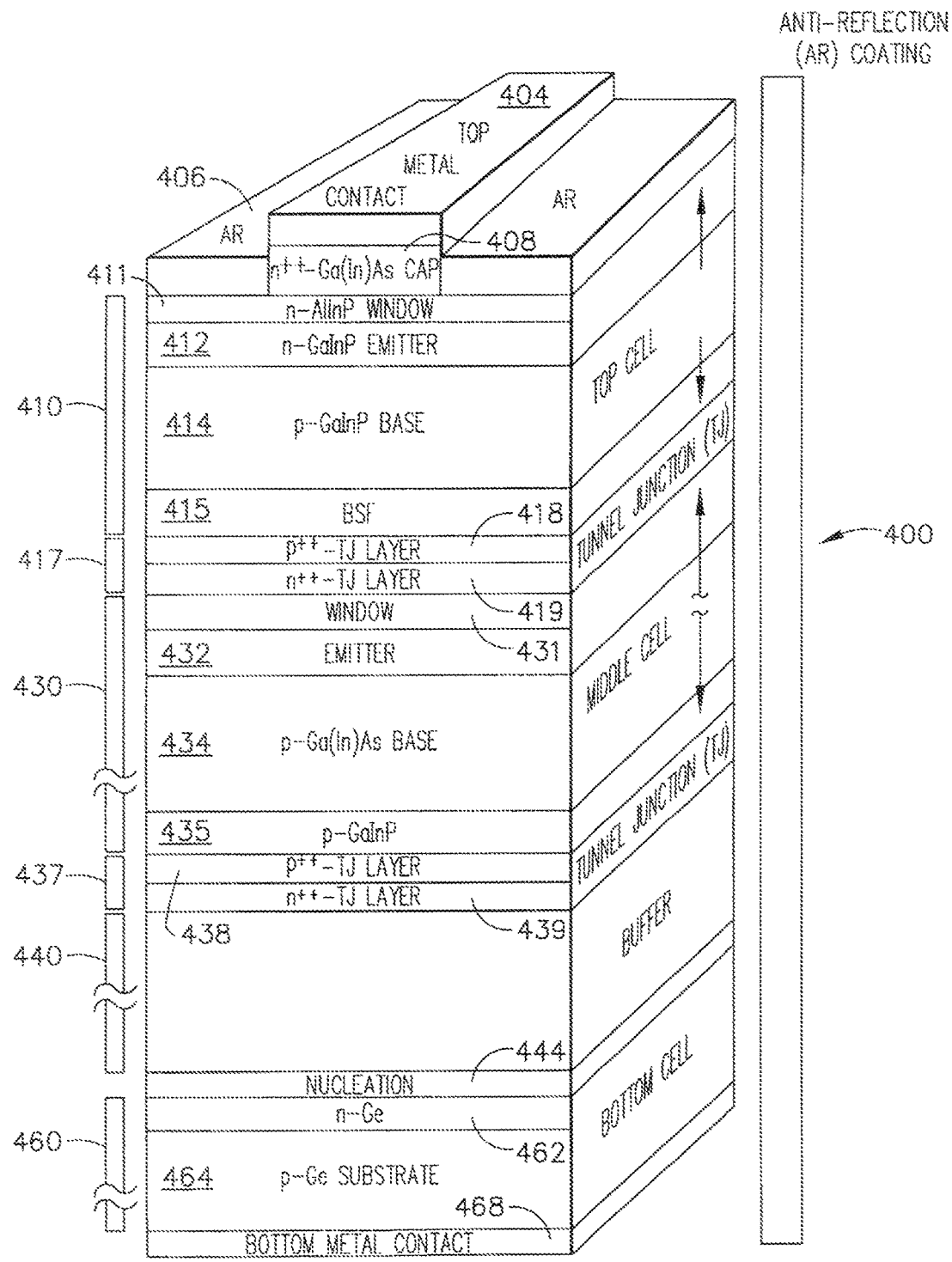
FIG. 4 is a schematic representation of a multijunction solar cell in accordance with the invention.

Although it is particularly advantageous for a top subcell, the process of the present invention may be used to make any or all of the subcells in a multijunction (MJ) photovoltaic cell. FIG. 4 depicts a cross-section of a MJ cell 400 representing one embodiment of the present invention having three subcells, 410, 430, and 460, connected in electrical series. The subcells 410, 430, 460 that form the MJ cell 400 are referred to according to the material of their respective base layer 414, 434, and 464. For instance, in FIG. 4, the multijunction cell 400 can be composed of a GaInP subcell 410 with a GaInP base layer 414, a Ga(In)As subcell 430 with a Ga(In)As base layer 434 (where the parentheses around In indicate that the base may be composed of GaInAs or GaAs), and a Ge subcell 460 with a Ge base layer 464 composed of a Ge growth substrate.

The subcells 410, 430, and 460 may also be referred to by the order in which light strikes each subcell as it enters the front of the MJ cell 400. For instance, in FIG. 4, the subcell 410 may also be referred to as the top subcell or subcell 1, the subcell 430 may be referred to as the middle subcell or subcell 2, and the Ge subcell 460 as the bottom subcell or subcell 3. In general, n subcells may be connected in series, where n may be equal to 1 for a single junction cell, or n may be any integer greater than or equal to 2 for a multijunction cell. The growth substrate may be electrically inactive, or, it may be electrically active, thereby forming one of the n subcells in the multijunction cell.

For example, in FIG. 4, the Ge subcell 460 can be formed from the germanium wafer that serves as a substrate for epitaxial growth of the semiconductor layers that form the upper subcells, and as the main mechanical support for the cell, in addition to serving as one of the three active subcells in the 3-junction cell 400. The epitaxial growth of semiconductor layers on the substrate is typically initiated with a nucleation layer 444, and a buffer region 440, which may contain one or more semiconductor layers, which is typically grown between the nucleation layer 444 and the lowermost epitaxial subcell (in FIG. 4, this is the middle cell 430). A tunnel junction between the lowermost epitaxial subcell and the substrate may be placed either above, beneath, or in the body of the buffer region 440. In FIG. 4, the tunnel junction 437, which includes an n++-doped side 439 and a p++-doped side 438, is shown above the buffer region 440.

A tunnel junction 417 may connect the top subcell 410 and the middle subcell 430 in electrical series, and another tunnel junction 437 may connect the middle subcell 430 and the bottom subcell 440 in electrical series. In general, each of the n subcells in a MJ cell 400 may be connected in series to the adjacent subcell(s) by a tunnel junction, in order to form a monolithic, two-terminal, series-interconnected multijunction cell. In this two-terminal configuration, it is desirable to design the subcell thickness and band gaps such that each subcell has nearly the same current at the maximum power point of the current-voltage curve of each subcell, in order that one subcell does not severely limit the current of the other subcells. Alternatively, the subcells may be contacted by means of additional terminals, for instance, metal contacts to laterally conductive semiconductor layers between the subcells, to form 3-terminal, 4-terminal, and in general, m-terminal MJ cells where m is an integer greater than or equal to 2 (the case of m=2 is the special case of the two-terminal series-interconnected cell described above), and less than or equal to 2n, where n is the number of active subcells in the MJ cell. The subcells can be interconnected in circuits using these additional terminals such that most of the available photogenerated current density in each subcell can be used effectively, leading to high efficiency for the MJ cell, even if the photogenerated current densities are very different in the various subcells.

Window, emitter, base, and back-surface field (BSF) layers are shown in each of the subcells 410, 430, and 440 in FIG. 4. Window, emitter, base, and BSF layers in the top cell 410 include layers 411, 412, 414, and 415, respectively, and in the middle cell 430 include layers 431, 432, 434, and 435, respectively.

As shown in FIG. 4, the nucleation layer 444 can also serve as a window layer for the bottom cell 460. The buffer region 440 can also be considered as part of the window of the Ge subcell 460, though it has other functions as well, such as reducing crystal defects and improving morphology in the upper epitaxially-grown layers of the MJ cell 400. The emitter layer 462 of the Ge subcell 460 in FIG. 4 can be formed by diffusion into the p-type Ge substrate of column-V elements (which are n-type dopants in Ge) from the epitaxial growth of the III-V semiconductors on top of the Ge substrate. The base 464 of the Ge subcell 460 may consist of the bulk of the p-type Ge wafer that also serves as the growth substrate and mechanical support for the rest of the MJ cell 400. No BSF layer is shown at the back of the Ge subcell 460 in FIG. 4. However, a BSF layer such as a diffused $p^+$ region, or an epitaxially-grown group-IV or III-V semiconductor layer, on the back of the Ge subcell 460 is certainly an option in MJ cell technology, and would also help to improve the efficiency of the Ge subcell 460, as well as the overall MJ cell 400 efficiency.

The photogenerated current leaves the respective subcell through contacting layers, which are typically heavily-doped semiconductor layers, but may be composed of other types of conductive material, such as conductive oxides or metal, which may be transparent or opaque over different wavelength ranges. The contacting layers for the top subcell 410 in FIG. 4 can be the cap layer 408 on the front of the subcell 410 (which, in turn, is contacted by the metal grid pattern 404 on the top of the MJ cell 400), and the $p^{++}$-doped side 408 of the tunnel junction 417 on the back surface of the top subcell 410. The cap layer 408 may be disposed within an antireflective coating layer 406 that is disposed above the window layer 411 of the top subcell 410 as shown in FIG. 4. The contacting layers for the middle subcell 430 in FIG. 4 may be the $n^{++}$-doped side 419 of the tunnel junction 417 on front of the middle subcell 430, and the $p^{++}$-doped side 418 of the tunnel junction 417 on the back surface of the middle subcell 430. The contacting layers for the Ge bottom subcell 460 in FIG. 4 may be the $n^{++}$-doped side 439 of the tunnel junction 437 on front of the buffer region 440 (provided that the buffer region 440 is considered to be part of the window structure for the Ge subcell 460), and the back metal contact 468 on the back surface of the bottom subcell 460 (which is also the back surface of the entire MJ cell 400).

The contacting layers may be unpatterned, as in the case of the back metal contact 468 on the bottom subcell 460, or a transparent conductive oxide contacting the top cell window 411 or emitter 412, in place of the more conventional solar cell grid. The contacting layers may also patterned, as in the case of the patterned heavily-doped cap 408 and metal contact 404 that form the front grid of most solar cells, as shown in FIG. 4.

The lateral conductivity of the emitter and window layers between gridlines is important, since after minority carriers in the base (minority electrons in the case of the p-type top cell base 414 shown in FIG. 4) are collected at the base/emitter p-n junction between the gridlines, the collected carriers, which are now majority carriers in the emitter (majority electrons in the n-type top cell emitter 412 in FIG. 4), must be conducted to the gridlines with minimum resistive loss. Both the top cell emitter layer 412 and window layer 411 take part in this lateral majority-carrier conduction to the gridlines. While maintaining this high conductivity, the window 411 and emitter layers 412 should remain highly transmissive to photon energies that can be used effectively by the base 414 of the top cell 410 and by the other active subcells 430 and 460 in the MJ cell 400, and should have a long diffusion length for minority-carriers that are photogenerated in the window 411 and emitter layers 412 (minority holes in the case of the n-type emitter shown in FIG. 4), so that they may be collected at the p-n junction before recombining Since the transmittance and diffusion length both tend to decrease for high doping levels, an optimum doping level typically exists at which cell efficiency is maximized, for which the conductivity of the window 411 and emitter layer 412 is high enough that resistive losses are small compared to the power output of the cell 410, and yet the transmittance and minority-carrier collection in the window 411 and emitter layer 412 are high enough that most of the photons incident on the cell 410 generate useful current.

The highly-doped layers that form the tunnel junctions between cells, with their very low sheet resistance, may also serve as lateral conduction layers, helping to make the current density across the MJ cell 400 more uniform in the case of spatially non-uniform intensity or spectral content of the light incident on the cell. Laterally-conductive layers between the subcells 410 and 430, and on the back of the bottom cell 460, are also very important in the case of MJ cell designs which have more than two terminals, for instance, in mechanically-stacked or monolithically-grown MJ cells with 3, 4, or more terminals in order to operate the subcells at current densities that are not all necessarily the same, in order to optimize the efficiency of each subcell and hence of the entire MJ cell. Laterally-conductive regions between the subcells 410 and 430 and at the back of the bottom cell 460 are also important for configurations with 3, 4, or more terminals in which the subcells are interconnected with other circuit elements, such as bypass or blocking diodes, or in which the subcells from one MJ cell are connected with subcells in another MJ cell, in series, in parallel, or in a combination of series and parallel, in order to improve the efficiency, voltage stability, or other performance parameter of the photovoltaic cell circuit.

Note that a variety of different semiconductor materials may be used for the window layers 411, 431, 440, and 444 (the primary function of 440 is the buffer region, and the primary function of layer 444 is that of the nucleation layer, but they also serve as window layers for the bottom cell 60); the emitter layers 412, 432, and 462; the base layers 414, 434, 464; and the BSF layers 415 and 435 including AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, ALN, GaN, InN, GaInN, AlGaInN, GaInNAs, AlGaInNAs, Ge, Si, SiGe, ZnSSe, CdSSe, and other materials and still fall within the spirit of the present invention. Additionally, while the growth substrate and base layer 464 is preferably a p-Ge growth substrate and base layer, other semiconductor materials may be used as the growth substrate and base layer 464, or only as a growth substrate. These include, but are not limited to, GaAs, InP, GaSb, InAs, InSb, GaP, Si, SiGe, SiC, Al$_2$O$_3$, Mo, stainless steel, soda-lime glass, and SiO$_2$.

EXAMPLES

To demonstrate the ability to improve the efficiency of a device using the processes 200 and 300, dual junction GaInP/Ga(In)As/Ge solar cells were grown on 4" Ge (001) 60 miscut wafers. One growth was subjected to Sb with a flow of TESb during the top cell growth and a control growth was not. From these wafers, 1 cm×1 cm non-antireflective coated solar cells were fabricated and tested. A diagram of the structure is shown in FIG. 4. The Sb was used specifically in region 410 of the sample.

Figure 5:
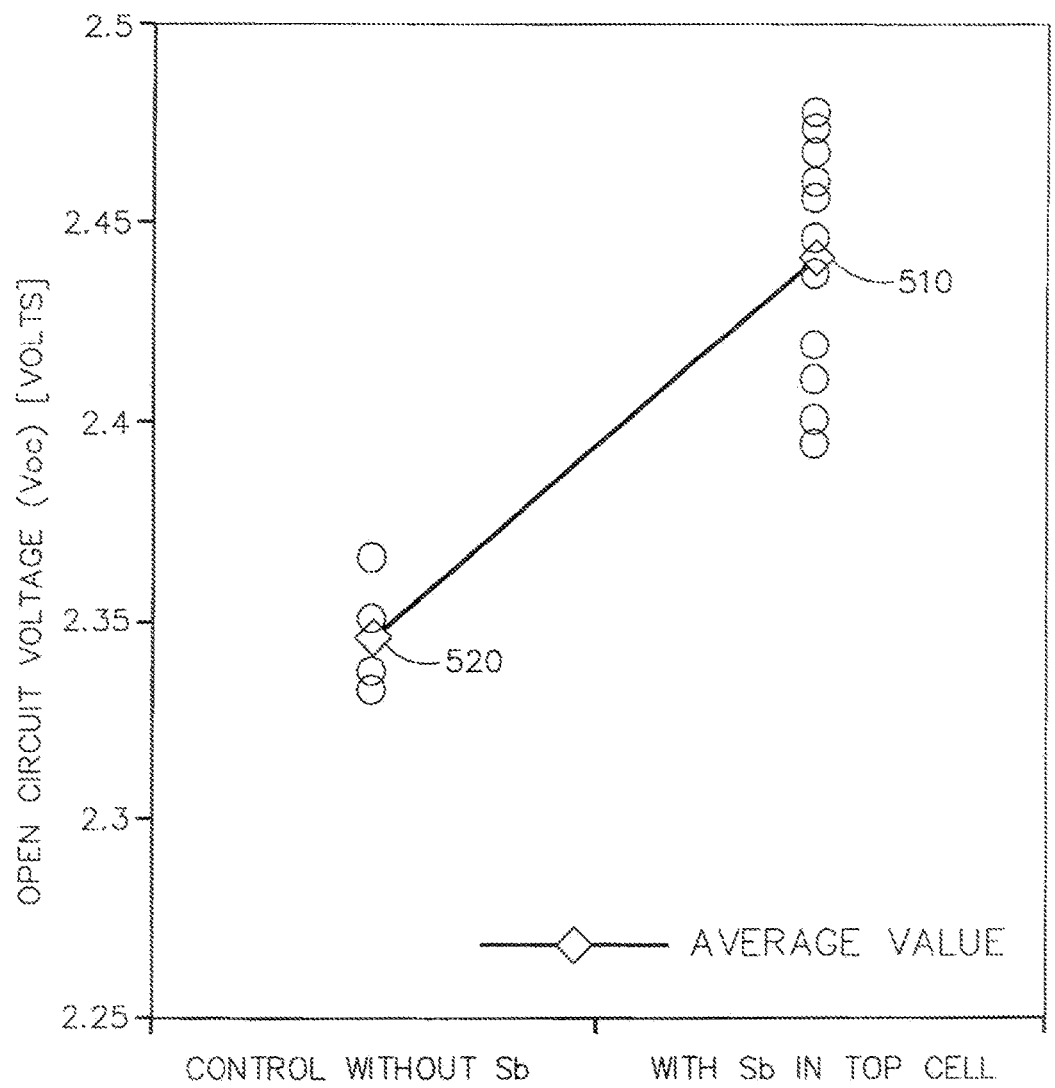
FIG. 5 is a graphical representation of an average increase in VOC in accordance with the invention.
Figure 6:
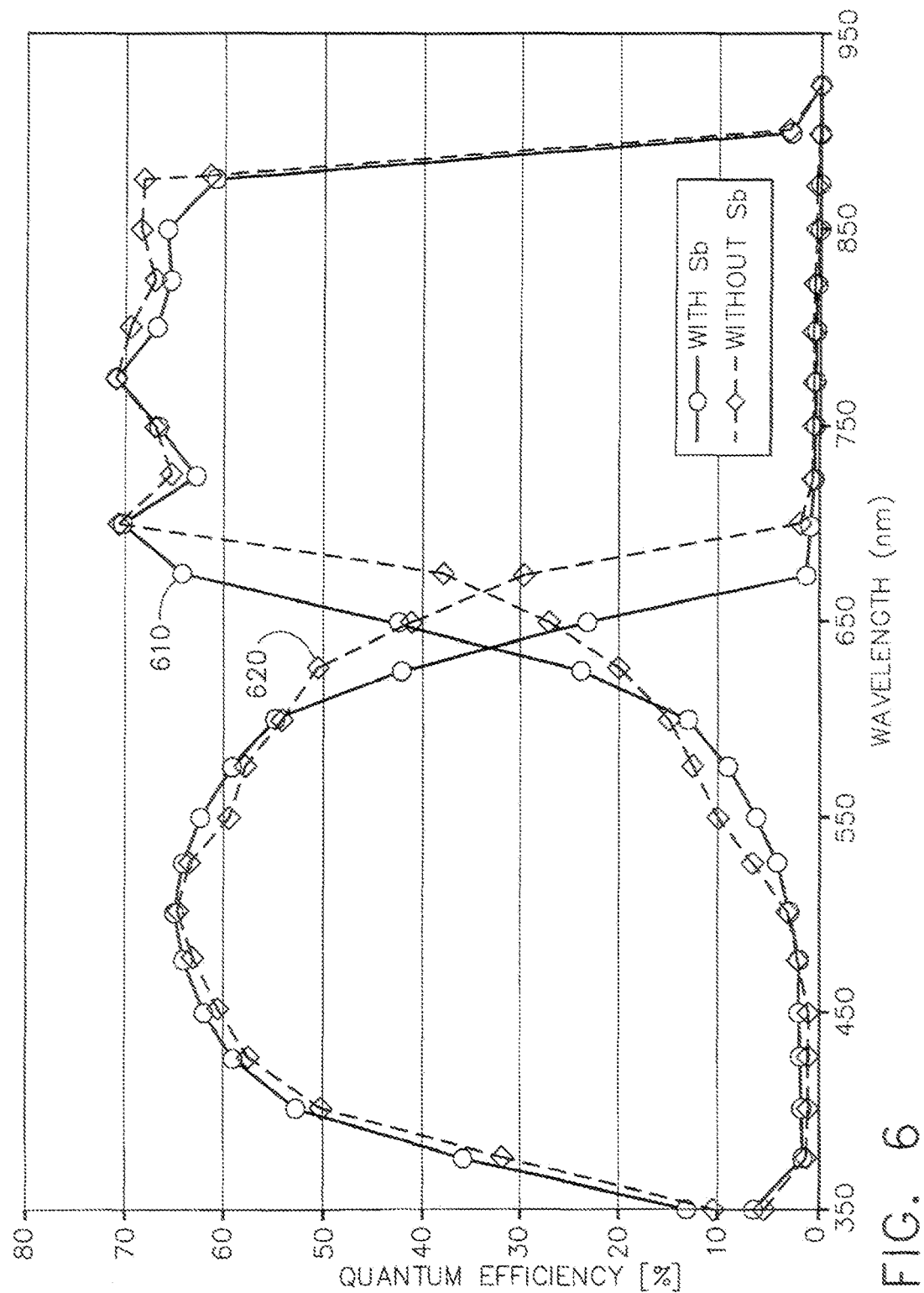
FIG. 6 is a graphical representation illustrating an increase in band gap in accordance with the invention.

The open circuit voltages averaged from illuminated current-voltage (LIV) measurements of 10 cells for each growth condition are shown in FIG. 5. The addition of Sb to the growth of the top cell shows an average increase 510 in VOC of 94 mV over the VOC of the control sample 520. This represents an increase of 4% absolute increase in voltage. The increased band gap may also be observed in the spectral response measurements shown in FIG. 6. The quantum efficiency of the top cell becomes zero at the band gap of the top cell. The sample with the Sb 610 indicates a cut-off at a shorter wavelength than that of the control sample top cell 620, indicating a higher band gap. The calculated band gap of the control sample is .about.1.770 eV, while that of the surfactant-modified sample is 1.849 eV, an increase of 79 meV in band gap.

As will be appreciated by those skilled in the art, processes 200 and 300 may be employed to provide a GaInP/GaAs/GaInNAs/Ge 4-junction cell with increased band gap of the GaInP (or AlGaInP) top subcell to thereby increase its voltage and improve current matching. In addition, the method of the invention may be employed to disorder layers of MJ solar cells including a GaInP/Ga(In)As/Ge (or GaInP/GaAs/GaInNAs/Ge or similar) MJ cell, with GaInP top cell (TC) having:

1. High-Eg (high band gap) AlInP top cell (TC) window due to group-III sublattice disordering induced by Sb surfactant (Sb-induced disorder), in either lattice-matched or lattice-mismatched AlInP window. Increases transmission of short wavelength light to top cell emitter and base;

2. High-E$_g$ GaInP (or AlGaInP) TC heterojunction emitter with band gap E$_g$ of ~1.9 eV due to Sb-induced disorder, on a nominally lattice-matched, low-E$_g$GaInP TC base with .about.1.8 eV E$_g$ due to ordering on group-III sublattice in the absence of Sb, for which composition of GaInP base is nominally the same as that of the GaInP emitter. Increases transmission of light to top cell base and reduces minority-carrier injection into emitter. Since heterojunction between base and emitter is between GaInP layers of the same composition and lattice constant, differing only in the amount of group-III sublattice ordering and the resultant difference in band gap, the density of interface states at the junction should be minimal, less than at other types of heterojunctions between semiconductors of different compositions, thus reducing minority-carrier recombination and increasing solar cell efficiency;

3. High-E$_g$GaInP (or AlGaInP) TC heterojunction back-surface field (BSF) layer with band gap E$_g$ of ~1.9 eV due to Sb-induced disorder, beneath a nominally lattice-matched, low-Eg GaInP TC base with ~1.8 eV E$_g$ due to ordering on group-III sublattice in the absence of Sb, for which composition of GaInP base is nominally the same as that of the GaInP BSF. Larger band gap difference between base and BSF reduces minority-carrier injection into BSF layer. As for the heterojunction emitter case in 2 above, since the heterojunction between base and BSF is between GaInP layers of the same composition and lattice constant, the density of interface states at the junction should be minimal, thus reducing minority-carrier recombination and increasing solar cell efficiency;

4. High-E$_g$ GaInP (~1.9 eV) (and/or AlGaInP, AlInP) due to Sb-induced disorder used throughout GaInP-base top cell, to increase band gap of top cell, thus bringing the combination of GaInP top cell band gap and Ga(In)As middle cell (MC) band gap closer to the theoretical optimum for efficient conversion of the space and/or terrestrial solar spectra. Increases multijunction cell efficiency;

5. High-E$_g$ GaInP (~1.9 eV) (and/or AlGaInP, AlInP) due to Sb-induced disorder used in either n-type or p-type side of tunnel junction beneath GaInP TC. Increases transmission of light for conversion by Ga(In)As middle cell. Becomes more important when top cell is formed from high-E$_g$ GaInP as in 4 above, since top cell then transmits more light that could be absorbed by GaInP (~1.8 eV);

6. High-E$_g$ GaInP (~1.9 eV) (and/or AlGaInP, AlInP) due to Sb-induced disorder used in GaInP window of Ga(In)As-base middle cell. Increases transmission of light through GaInP MC window, where minority-carrier collection efficiency can be low, to the Ga(In)As MC emitter and base layers where minority-carrier collection is more efficient. Becomes more important when top cell is formed from high-E$_g$. GaInP as in 4 above, since top cell then transmits more light that could be absorbed by low-E$_g$ GaInP (~1.8 eV);

7. Graded band gap in GaInP TC emitter due to varying amounts of Sb-induced disorder, from ~1.9 eV (disordered) at the sunward side of the emitter (the emitter/window interface) to ~1.8 eV (ordered) at the base/emitter junction. Helps to collect minority carriers photogenerated in the emitter by creating an electric field that sweeps the carriers toward the p-n junction at the base/emitter interface. Becomes especially important when the minority-carrier lifetime in the emitter is degraded, as happens in solar cells exposed to radiation in space, or in cells with very heavy doping in the emitter to reduce sheet resistance, e.g., for concentrator solar cells or cells with reduced metal coverage;

8. Graded band gap in GaInP TC base due to varying amounts of Sb-induced disorder, from ~1.9 eV (disordered) at the back of the base (the BSF/base interface) to ~1.8 eV (ordered) at the base/emitter junction. Helps to collect minority carriers photogenerated deep in the base (far from the collecting junction) by creating an electric field that sweeps the carriers toward the p-n junction at the base/emitter interface. Becomes especially important when the minority-carrier lifetime in the base is degraded, e.g., as happens in solar cells exposed to radiation in space;

9. High-$E_g$ GaInP (~1.9 eV) cell 1 (top cell) due to Sb-induced disorder, on top of a low-$E_g$ GaInP (~1.8 eV) cell 2 grown with high ordering on the group-III sublattice in the absence of Sb, for use in cells such as a 4-junction GaInP(high-$E_g$, thin)/GaInP(low-$E_g$, thick)/Ga(In)As/Ge cell, or a 5-junction GaInP(high-$E_g$, thin)/GaInP(low-$E_g$, thick)/Ga(In)As/GaInNAs/Ge cell (ref. U.S. Pat. No. 6,316,715; R. R. King, D. E. Joslin, and N. H. Karam, "Multijunction Photovoltaic Cell with Thin 1st (Top) Subcell and Thick 2nd Subcell of Same or Similar Semiconductor Material"). Allows a convenient method to achieve a large difference in the band gaps of GaInP cell 1 and GaInP cell 2 (nominally of the same composition), thus making current matching between cell 1 and cell 2 easier for use in a series-interconnected multijunction cell. In this way, the requirement to make the GaInP cell 1 very thin and the GaInP cell 2 very thick in order to achieve current matching is somewhat relaxed;

10. High-$E_g$ GaInP layers used in optoelectronic or electronic devices other than solar cells, as in heterojunction bipolar transistors (HBTs) with high-$E_g$. GaInP emitter and/or collector layers due to Sb-induced disorder, or single- or double-heterostructure semiconductor lasers with high-$E_g$. GaInP carrier confinement layers due to Sb-induced disorder. Reduces minority-carrier injection into layers other than the base of an HBT, thus increasing gain, or into layers other than the lasing medium of a semiconductor laser, thus reducing the current threshold for lasing and increasing lasing efficiency;

11. High-$E_g$ GaInP (~1.9 eV) barriers due to Sb-induced disorder, for confinement of carriers in low-$E_g$ GaInP (~1.8 eV) quantum wells (QWs) grown with a high amount of group-III sublattice ordering in the absence of Sb, with the same nominal GaInP composition in the wells and barriers, used in the base of a solar cell to achieve photocarrier generation by absorption of photons with energy as low as that of the low-$E_g$ GaInP band gap (~1.8 e V), while achieving the high solar cell voltages typical for a solar cell base with the band gap of the high-$E_g$ GaInP barrier material (~1.9 eV). These ordered QW/disordered barrier GaInP structures could also be used in a strain-balanced QW/barrier configuration, with the barrier band gap made higher by use of Sb-induced disordering and a Ga-rich GaInP composition, and the QW band gap made lower by use of high group-III sublattice ordering in the absence of Sb and an In-rich GaInP composition;

12. High-$E_g$ GaInP (~1.9 e V) barriers due to Sb-induced disorder, for confinement of carriers in low-$E_g$ GaInP (~1.8 e V) quantum wells (QWs) grown with a high amount of group-II sublattice ordering in the absence of Sb, with the same nominal GaInP composition in the wells and barriers, used in optoelectronic or electronic devices other than solar cells, such as quantum well lasers. As in the quantum well solar cells in 11 above, these ordered QW/disordered barrier GaInP structures could also be used in a strain-balanced QW/barrier configuration, with the barrier band gap made higher by use of Sb-induced disordering and a Ga-rich GaInP composition, and the QW band gap made lower by use of high group-III sublattice ordering in the absence of Sb and an In-rich GaInP composition;

13. High-$E_g$ GaInP middle cell heterojunction emitter with band gap of ~1.9 eV due to Sb-induced disorder, on Ga(In)As middle cell base. Increases transmission of light to middle cell base and reduces minority-carrier injection into emitter, though even low-$E_g$ GaInP (~1.8 eV) does this fairly effectively on Ga(In)As-base MC; and 14. High-$E_g$ GaInP middle cell heterojunction BSF layer with band gap of ~1.9 eV due to Sb-induced disorder, in back of Ga(In)As middle cell base. Reduces minority-carrier injection into BSF layer, though even low-$E_g$ GaInP (~1.8 e V) does this fairly effectively on Ga(In)As-base MC.

It should be understood, of course, that the foregoing relates to preferred embodiments of the invention and that modifications may be made without departing from the spirit and scope of the invention as set forth in the following claims.

The invention claimed is:
1. A method of making a III-V optoelectronic device, comprising:
 growing a lower structure;
 introducing an isoelectronic surfactant in a molar ratio of isoelectronic surfactant to group-III precursor that is between about $1\times10^{-5}$ to 0.2;
 growing a subsequent structure at a reduced pressure of 10 to 100 torr in the presence of the isoelectronic surfactant;
 allowing the isoelectronic surfactant to desorb; and
 growing the subsequent structure:
  wherein a band gap associated with the subsequent structure is increased by a disordering induced by the isoelectronic surfactant to substantially match a photogenerated current between the subsequent structure and one or more other layers;
  wherein the subsequent structure is characterized by an ordering parameter η that is at most about 0.3 where

$$\eta = \frac{\sqrt{2005 - E_{peak,12k}}}{471}$$

wherein the subsequent structure has a band gap of about 1.9 eV; and wherein $E_{peak,\ 12k}$ is the measured photoluminescence peak energy measured in meV at 12K.

2. The method of claim 1, wherein the lower structure comprises a bottom subcell and a middle subcell.

3. The method of claim 1, wherein a first side of the subsequent structure comprises an n-type side.

4. The method of claim 1, wherein introducing the isoelectronic surfactant comprises pausing growth for about 0.1 to 5 minutes.

5. The method of claim 1, wherein the subsequent structure comprises a top layer selected from the group consisting of GaInP, GaInAs, GaAsSb, GaPAs, GaInPAs, AlInP, AlGaInP, AlGaAs, AlGaInAs, AlGaAsSb, AlGaPAs, AlInAs, InPAs, AlInPAs, SiGe, CdZnSe, CdZnTe, ZnSSe, ZnSeTe, CuGaInSe, CuGaInSSe, and AgGaInSe.

6. The method of claim 1, wherein the isoelectronic surfactant comprises Sb.

7. The method of claim 6, wherein the subsequent structure comprises GaInP.

8. The method of claim 7, wherein the GaInP comprises one of $Ga_{0.505}In_{0.495}P$ and $Ga_{0.515}In_{0.485}P$.

9. The method of claim 7, wherein introducing the isoelectronic surfactant comprises introducing according to the molar ratio as TESb/(TMGa+TMIn) wherein TESb is triethylantimony, TMGa is trimethylgallium, and TMIn is trimethylindium.

10. The method of claim 9, wherein the molar ratio is between about $1 \times 10^{-5}$ to 0.1.

11. The method of claim 1, wherein the device comprises a solar cell.

12. The method of claim 1, wherein the reduced pressure is about 25 torr.

13. A method of making a III-V optoelectronic device, comprising:
    growing a lower structure;
    growing a first side and a second side of a tunnel junction;
    introducing an isoelectronic surfactant in a molar ratio of isoelectronic surfactant to group III precursor that is between about $1 \times 10^{-5}$ to 0.2;
    increasing a band gap associated with a top structure by growing the top structure in the presence of the isoelectronic surfactant at a pressure of 10 to 100 torr;
    allowing the isoelectronic surfactant to desorb; and
    growing a subsequent structure:
        wherein the band gap associated with the top structure is increased by a disordering induced by the isoelectronic surfactant to substantially match a photogenerated current between the top structure and one or more other layers;
        wherein the top structure is characterized by an ordering parameter η that is at most about 0.3 where $$\eta = \frac{\sqrt{2005 - E_{peak,12k}}}{471}$$

wherein the top structure has a band gap of about 1.9 eV;
        wherein $E_{peak,\ 12k}$ is the measured photoluminescence peak energy measured in meV at 12K; and
        wherein the device functions as an optoelectronic device.

14. The method of claim 13, wherein the lower structure comprises a bottom subcell and a middle subcell.

15. The method of claim 13, wherein the first side of the tunnel junction comprises an n-type side.

16. The method of claim 13, wherein introducing the isoelectronic surfactant comprises pausing growth for about 0.1 to 5 minutes.

17. The method of claim 13, wherein the top structure comprises a composition selected from the group consisting of GaInP, GaInAs, GaAsSb, GaPAs, GaInPAs, AlInP, AlGaInP, AlGaAs, AlGaInAs, AlGaAsSb, AlGaPAs, AlInAs, InPAs, AlInPAs, SiGe, CdZnSe, CdZnTe, ZnSSe, ZnSeTe, CuGaInSe, CuGaInSSe, and AgGaInSe.

18. The method of claim 13, wherein the isoelectronic surfactant comprises Sb.

19. The method of claim 18, wherein the top structure comprises one of $Ga_{0.505}In_{0.495}P$ and $Ga_{0.515}In_{0.485}P$.

20. The method of claim 19, wherein introducing the isoelectronic surfactant comprises introducing according to the molar ratio as TESb/(TMGa+TMIn) wherein TESb is triethylantimony, TMGa is trimethylgallium, and TMIn is trimethylindium.

21. The method of claim 20, wherein the molar ratio is between about $1 \times 10^{-5}$ to 0.1.

22. The method of claim 13, wherein the device comprises a solar cell.

23. A method of making a solar cell having a GaInP top layer, comprising:
    growing a lower structure;
    introducing an isoelectronic surfactant selected from the group consisting of Sb, As, Bi, Tl, the isoelectronic surfactant being present in a molar ratio of isoelectronic surfactant to group III precursor that is at least $1 \times 10^{-5}$; and
    growing a subsequent structure that comprises a top layer at a reduced pressure of 10 to 100 torr in the presence of the isoelectronic surfactant,
        wherein the top layer comprises GaInP:
        wherein a band gap associated with the top layer is increased by a disordering induced by the isoelectronic surfactant to substantially match a photogenerated current between the top layer and one or more other layers;
        wherein the top layer is characterized by an ordering parameter η that is at most about 0.3 where $$\eta = \frac{\sqrt{2005 - E_{peak,12k}}}{471}$$

wherein the top layer has a band gap of about 1.9 eV; and
        wherein $E_{peak,\ 12k}$ is the measured photoluminescence peak energy measured in meV at 12K.

24. The method of claim 23, wherein the top layer is further characterized by a formula selected from the group consisting of:
    $Ga_{0.515}In_{0.485}P_{1-x}Sb_x$, $Ga_{0.515}In_{0.485}P_{1-x}Bi_x$, $Ga_{0.515}In_{0.485}P_{1-x}As_x$, and $(Ga_{0.515}In_{0.485})_{1-x}Tl_xP$.

25. The method of claim 23, wherein the isoelectronic surfactant is Sb and is introduced in the molar ratio that is defined as TESb/(TMGa+TMIn)=about $1 \times 10^{-5}$ to 0.1, wherein TESb is triethylantimony, TMGa is trimethylgallium, and TMIn is trimethylindium.

26. A method of making a solar cell having a GaInP top layer, comprising:
    growing a lower structure;
    introducing Sb as an isoelectronic surfactant in a molar ratio of TESb/(TMGa+TMIn) that equals about $1 \times 10^{-5}$ to 0.1; and growing a subsequent structure that comprises a top layer at a reduced pressure of 10 to 100 torr in the presence of the isoelectronic surfactant, and wherein the top layer comprises GaInP:

wherein a band gap associated with the top layer is increased by a disordering induced by the isoelectronic surfactant to substantially match a photogenerated current between the top layer and one or more other layers;

wherein the top layer is characterized by an ordering parameter η that is at most about 0.3 where $$\eta = \frac{\sqrt{2005 - E_{peak,12k}}}{471}$$

wherein the top layer has a band gap of about 1.9 eV; and wherein $E_{peak,\ 12k}$ is the measured photoluminescence peak energy measured in meV at 12K.

27. The method of claim 26, wherein the molar ratio equals 0.012.

28. The method of claim 26, wherein the lower structure comprises a bottom subcell and a middle subcell.

* * * * *

UNITED STATES PATENT AND TRADEMARK OFFICE
CERTIFICATE OF CORRECTION

PATENT NO. : 9,745,668 B2
APPLICATION NO. : 14/499452
DATED : August 29, 2017
INVENTOR(S) : Christopher M. Fetzer et al.

It is certified that error appears in the above-identified patent and that said Letters Patent is hereby corrected as shown below:

In the Specification

In Column 6, Lines 18-23, delete " $\eta = \dfrac{\sqrt{2005 - E_{peak,12k}}}{471}$ " and insert -- $\eta = \sqrt{\dfrac{2005 - E_{peak,12k}}{471}}$ --, therefor.

In the Claims

In Column 14, Lines 62-65, in Claim 1, delete " $\eta = \dfrac{\sqrt{2005 - E_{peak,12k}}}{471}$ " and insert -- $\eta = \sqrt{\dfrac{2005 - E_{peak,12k}}{471}}$ --, therefor.

In Column 15, Line 13, in Claim 5, delete "AlinAs," and insert -- AlInAs, --, therefor.

In Column 15, Lines 52-58, in Claim 13, delete " $\eta = \dfrac{\sqrt{2005 - E_{peak,12k}}}{471}$ " and insert -- $\eta = \sqrt{\dfrac{2005 - E_{peak,12k}}{471}}$ --, therefor.

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,745,668 B2

In Column 16, Line 7, in Claim 17, delete "AlinAs," and insert -- AlInAs, --, therefor.

In Column 16, Line 16, in Claim 20, delete "+TMin)" and insert -- +TMIn) --, therefor.

In Column 16, Line 23, in Claim 23, delete "GainP" and insert -- GaInP --, therefor.

In Column 16, Lines 42-47, in Claim 23, delete "$\eta = \frac{\sqrt{2005 - E_{peak,12k}}}{471}$" and insert -- $\eta = \sqrt{\frac{2005 - E_{peak,12k}}{471}}$ --, therefor.

In Column 16, Line 66, in Claim 26, delete "+TMin)" and insert -- +TMIn) --, therefor.

In Column 17, Lines 12-18, in Claim 26, delete "$\eta = \frac{\sqrt{2005 - E_{peak,12k}}}{471}$" and insert -- $\eta = \sqrt{\frac{2005 - E_{peak,12k}}{471}}$ --, therefor.